United States Patent
Matuz et al.

(10) Patent No.: US 11,309,917 B2
(45) Date of Patent: Apr. 19, 2022

(54) BASE PARITY-CHECK MATRICES FOR LDPC CODES THAT HAVE SUBSETS OF ORTHOGONAL ROWS

(71) Applicant: Huawei Technologies Co., Ltd., Shenzhen (CN)

(72) Inventors: Balazs Matuz, Cologne (DE); Gianluigi Liva, Cologne (DE); Onurcan Iscan, Munich (DE); Ronald Boehnke, Munich (DE); Wen Xu, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/901,934

(22) Filed: Jun. 15, 2020

(65) Prior Publication Data

US 2020/0313696 A1 Oct. 1, 2020

Related U.S. Application Data

(63) Continuation of application No. PCT/EP2017/083130, filed on Dec. 15, 2017.

(51) Int. Cl.
*G06F 11/00* (2006.01)
*H03M 13/11* (2006.01)
*H03M 13/00* (2006.01)

(52) U.S. Cl.
CPC ..... *H03M 13/1185* (2013.01); *H03M 13/616* (2013.01)

(58) Field of Classification Search
CPC .......................... H03M 13/1185; H03M 13/616
See application file for complete search history.

(56) References Cited

U.S. PATENT DOCUMENTS

| | | | |
|---|---|---|---|
| 9,742,439 B1 | 8/2017 | Graumann | |
| 10,484,012 B1* | 11/2019 | Tunali | H03M 13/1125 |
| 2003/0014718 A1 | 1/2003 | De Souza et al. | |
| 2005/0289437 A1 | 12/2005 | Oh et al. | |
| 2006/0129904 A1 | 6/2006 | Blankenship et al. | |

(Continued)

FOREIGN PATENT DOCUMENTS

| | | |
|---|---|---|
| CN | 1956368 A | 5/2007 |
| CN | 101119118 A | 2/2008 |

(Continued)

*Primary Examiner* — Samir W Rizk
(74) *Attorney, Agent, or Firm* — Leydig, Voit & Mayer, Ltd.

(57) ABSTRACT

Protograph-based LDPC codes are obtained from z-row-orthogonal base matrices with some additional structure constraints, such as a diagonal and/or double-diagonal structure, in order to allow a high parallelization that is a multiple of z, while having an efficient encoding or decoding. A "big" base matrix is constructed from a structured square submatrix in order to have a WiMAX-like structure and a z-row-orthogonality. Also, starting from a "smaller" base matrix having a part arranged in a double-diagonal shape with tail-biting one, an expansion by a factor equal to z can be performed, followed by an addition of a single one-entry into the last column at a specific location, thereby obtaining a three-degree column, and followed by a row and/or column permutation in order to obtain a base matrix in a WiMAX-like structure.

19 Claims, 4 Drawing Sheets

(56) References Cited

U.S. PATENT DOCUMENTS

| | | |
|---|---|---|
| 2010/0251062 A1 | 9/2010 | Chen et al. |
| 2013/0013983 A1 | 1/2013 | Livshitz et al. |
| 2018/0358984 A1* | 12/2018 | Richardson ........... H04L 1/0057 |
| 2019/0013827 A1* | 1/2019 | Richardson ........... H04L 1/1812 |
| 2019/0042356 A1* | 2/2019 | Chen ...................... G11C 16/26 |

FOREIGN PATENT DOCUMENTS

| | | |
|---|---|---|
| CN | 101373976 A | 2/2009 |
| CN | 102164022 A | 8/2011 |
| CN | 104158550 A | 11/2014 |
| CN | 105959015 A | 9/2016 |

* cited by examiner $$B1 = \begin{bmatrix} 1 & 1 & 1 & 1 & 1 & \square \\ 1 & 1 & 1 & 1 & \square & 1 \\ 1 & \square & 1 & \square & 1 & 1 \end{bmatrix}$$

Fig. 4

BASE PARITY-CHECK MATRICES FOR LDPC CODES THAT HAVE SUBSETS OF ORTHOGONAL ROWS

CROSS-REFERENCE TO RELATED APPLICATIONS

This application is a continuation of International Application No. PCT/EP2017/083130, filed on Dec. 15, 2017. the disclosure of which is hereby incorporated by reference in its entirety.

FIELD

The present disclosure relates to the field of information coding and decoding, and more particularly to the field of protograph-based low-density parity-check (LDPC) codes.

BACKGROUND

Modern LDPC codes are based on protographs, which are small bipartite graphs serving as a template for bigger codes and may be represented by a so-called base matrix. A bigger code is obtained by expanding or lifting a protograph, i.e., by copying the protograph q times and interconnecting the copies among each other while obeying some constraints. The factor q is also known as an expansion factor or a lifting factor in an interchangeable manner. Often, the expansion is performed on base matrices, with only one- and zero-entries, by replacing the one-entries by circulant permutation matrices (also known as circular permutation matrices) whose choice determines the connections between the nodes of the protograph copies. A compact way of representing a circulant permutation matrix of size (or dimension) q×q consists in merely giving the column index, ranging from 0 to q−1, of the one-entry in the first row. Then, the other entries follow automatically. This notation is referred to as the exponent of the circulant permutation matrix. Thus, a protograph base matrix and an exponent matrix containing the exponents of all circulants corresponding to one-entries in the protograph base matrix are sufficient to represent an LDPC code (LDPCC).

An advantage of using circulant permutation matrices lies in the fact that decoding can be parallelized since the resulting parity-check matrix (H) of the code has a specific structure: divide the parity-check matrix of size (n−k)×n into submatrices of size q×q. Each of these submatrices has a column weight of at most one (the column weight being the number of non-zero elements in a certain column), meaning that each code symbol participates in each of the q equations only once. In this way, q equations can be processed in parallel without introducing memory contention among the parallel check-node (row) operators. As the row operations are the bottleneck of LDPC decoding, parallelization ideally allows for performing the row operations in only 1/q of the time during LDPC decoding.

In practice, a single protograph can be used to describe a whole code family (i.e., codes of different block lengths) by changing the exponent matrix. However, if the expansion factor (q) is chosen too large, high error floors may occur. Consider a binary input additive white Gaussian node (AWGN) channel with a noise variance ($\sigma^2$), a code with a minimum distance ($d_{min}$), and a multiplicity of code words of lowest weight ($A_{dmin}$). Then, the block error probability ($P_B$) in the error floor region may be approximated by the following approximation relationship:

$$P_B \approx A_{dmin} \cdot \left[\exp\left(\frac{-1}{2\sigma^2}\right)\right]^{d_{min}} \quad (1)$$

It follows from this approximation that, whenever $P_B$ is plotted in the logarithmic domain, the height of the error floor is given by the term $A_{dmin}$, whereas the slope (or steepness) of the block error probability ($P_B$) curve is given by the term $d_{min}$. Thus, it is apparent that a low value of $A_{dmin}$ helps to reduce the error floor. Nevertheless, due to the use of circulant permutation matrices for protograph expansion, quasi-cyclic LDPC codes for which the multiplicity of code words of weight $A_{dmin}$ is a factor equal to q may be obtained, so that large expansion factors q may yield high error floors.

Thus, on one hand, a better parallelization may be obtained by using small base matrices with large expansion factors (q) and on the other hand, high values of expansion factors yield high error floors, thereby degrading the performance.

In order to avoid these high error floors while keeping the code description simple, it is a standard practice to use a relatively large base matrix with expansion factors (q) that are usually ranging from small to medium values (e.g., values below 400). However, this has the disadvantage that the parallelization of decoding suffers. As an example, take a base matrix of size 16×24, which is expanded by a factor 400 in order to obtain a parity-check matrix of size 6400×9600. Using a smaller base matrix, e.g., of size 4×6, and an expansion factor of 1600 would yield a parity-check matrix of the same size, but would present the advantage to yield a higher order of parallelism, which would be increased, in this example, by a factor of 4.

A viable solution to keep the parallelism while reducing the error floor problem may rely on multiple expansions of the protograph. More precisely, instead of one expansion step by a factor of q, two or more expansions steps by respective factors $q_i$ may be achieved assuming that $q \approx \Pi_i q_i$. Take an example of an expansion of a base matrix of size 2×3 carried out in two different ways as illustrated in respective FIGS. 1 and 2. A first one (FIG. 1) consists in an expansion in one step with q=4, and the second one (FIG. 2) consists in an expansion in two subsequent steps with $q_1$=2 in a first step and $q_2$=2 in a second step, such that $q_1 \times q_2$=q=4. In both cases, a parity-check matrix of size 8×12 corresponding to the expanded base matrix of size 2×3 is obtained. Thus, it can be observed that a parallelization by a factor of 4 for the check-node operators can be obtained in both cases, thereby proving that multiple expansion steps do not destroy the parallelism.

In practice, LDPC codes are described by their sparse parity-check matrix, which is well suited for performing decoding of the corrupted code word bits. On the other hand, encoding requires in general a transformation of the parity-check matrix by applying row (and column) operations, thereby leading to a modified parity-check matrix composed both of a dense part and an identity part. However, the corresponding dense submatrix may yield an encoding complexity which is quadratic in a given block length. A standard solution to avoid complex encoding is to have LDPC codes described by parity-check matrices that are structured in such a manner as to possess double-diagonal structures (e.g., for irregular repeat-accumulate (IRA) codes), double-diagonal and diagonal structures (e.g., for accumulate repeat-accumulate (ARA) codes, raptor LDPC codes) and triangular structures (e.g., for generalized irregular repeat-accumulate (GeIRA) codes, WiMax LDPC codes) amongst others. However, this structured part of the parity-check matrix may be destroyed by uncontrolled expansions, thereby rendering the encoding more complex.

SUMMARY

The present disclosure provides a type of protograph-based LDPC codes obtained from z-row orthogonal base matrices, the structure of which allows a high parallelization of the row decoding operations of these protograph-based LDPC codes.

According to a first aspect, the present disclosure relates to a device for providing a matrix (B) for data processing within a communication system, in particular encoding or decoding data. The matrix (B) may be of size mb×nb and composed of a set of submatrices. All or all but one submatrices may be of size z×nb with z>1 and at most one submatrix may be of size z'×nb with z'<z. The numbers mb and nb may respectively denote a number of rows and columns, and the numbers z, mb and nb may be positive natural numbers. All entries of the matrix (B) may be either zero or one, and each submatrix may have a maximum column weight of one.

According to an implementation form of the first aspect, the matrix (B) may comprise a square matrix (A) having one degree-3 column and degree-2 columns for the remaining columns. Thereby, the matrix (B) may have a WiMAX-like structure.

According to a further implementation form of the first aspect, the degree-2 columns of the square matrix (A) may be arranged in a double-diagonal structure.

According to a further implementation form of the first aspect, the matrix (B) may comprise a square matrix (A') having one degree-1 column and degree-2 columns for the remaining columns. Thereby, the matrix (B) may have an IRA-like structure.

According to a further implementation form of the first aspect, the degree-2 columns of the square matrix (A') may be arranged in a double-diagonal structure.

According to the second aspect, the present disclosure relates to a method for providing a matrix (B), in particular as provided in the first aspect, for data processing within a communication system, in particular encoding or decoding data. The method may comprise the step of constructing a first matrix (B1), wherein all entries of the first matrix may be either zero or one, the step of expanding the first matrix (B1) by a factor equal to z into an expanded matrix (B2) of size mb×nb in such a manner that the expanded matrix (B2) may be z-row-orthogonal, and the step of modifying the expanded matrix (B2) into a second matrix (B) of size mb×nb in such a manner that the second matrix (B) may be z-row-orthogonal.

According to an implementation form of the second aspect, the step of modifying the expanded matrix (B2) may comprise the step of adding into the expanded matrix (B2) or removing from the expanded matrix (B2) at least one entry equal to one at a respective location of the expanded matrix (B2) that may be chosen in such a manner that the second matrix (B) may be z-row-orthogonal.

According to a further implementation form of the second aspect, the step of modifying the expanded matrix (B2) may comprise the step of permuting at least one column and/or at least one row of the expanded matrix (B2) in such a manner that the second matrix (B) may be z-row-orthogonal.

According to a further implementation form of the second aspect, the step of modifying the expanded matrix (B2) may comprise the step of adding into the expanded matrix (B2) or removing from the expanded matrix (B2) at least one row in such a manner that the second matrix (B) may be z-row-orthogonal.

According to the third aspect, the present disclosure relates to a method for providing a matrix (B), in particular as provided in the first aspect, for data processing within a communication system, in particular encoding or decoding data. The method may comprise the step of constructing a matrix (B) of size mb×nb comprising a submatrix (A). The submatrix (A) may be a square matrix whose entries may be either zero or one in such a manner that the submatrix (A) may have one degree-3 column and degree-2 columns for the remaining columns, and all entries other than the entries of the submatrix (A) may be zero such that the matrix (B) may be z-row-orthogonal.

According to an implementation form of the third aspect, the degree-2 columns of the submatrix (A) may be arranged in a double-diagonal structure.

According to a further implementation form of the third aspect, the method may comprise the step of adding, at a respective location of the matrix (B), at least one entry equal to one into the matrix (B), wherein the respective location may be chosen to preserve a z-row orthogonality of the matrix (B).

According to the fourth aspect, the present disclosure relates to a method for providing a matrix (B), in particular as provided in the first aspect, for data processing within a communication system, in particular encoding or decoding data. The method may comprise the step of constructing a first matrix (B̈) of size mb/z×nb/z, wherein the rightmost part of the first matrix (B̈) may be in a double-diagonal shape with tail-biting one and form a first submatrix (Ä), the step of expanding the first matrix (B̈) by a factor equal to z in order to obtain a second matrix (B') in such a manner that the second matrix (B') may be z-row-orthogonal, the step of adding, at a respective location of the second matrix (B'), a single entry equal to one into the second matrix (B') in order to obtain a third matrix (B") in such a manner that the third matrix (B") may be z-row-orthogonal, and the step of permuting at least one column and/or at least one row of the third matrix (B") in order to obtain a fourth matrix (B''') in a diagonal form with tail-biting one.

According to an implementation form of the fourth aspect, the step of expanding the first matrix (B̈) may comprise the step of applying a cyclic shift of z×z identity matrices to the first matrix (B̈) amputated of the first submatrix (Ä), and the step of applying a cyclic shift of z×z identity matrices by z−1 to the right to the first submatrix (Ä) amputated of the tail-biting one.

According to a further implementation form of the fourth aspect, the single entry equal to one may be added at an intersection of the last column of the second matrix (B') and a predetermined row of the second matrix (B').

According to a further implementation form of the fourth aspect, the method may comprise the step of performing a column-wise cyclic shift of the rightmost part of the fourth matrix (B''') by one to the right in order to obtain a second submatrix (A) of size a×a, wherein a may be a positive natural number and the rightmost part of the fourth matrix (B''') form a third submatrix (A''') of size a×a, and the step of replacing the third submatrix (A''') with the second submatrix (A) in the fourth matrix (B''') in order to obtain a fifth matrix (B) being z-row-orthogonal.

According to the third and/or fourth aspect and/or any one of their implementation forms, the matrix (B) may have a WiMAX-like structure.

According to the second and/or third and/or fourth aspect and/or any one of their implementation forms, the matrix (B) may represent a low-density parity-check (LDPC) code.

According to the fifth aspect, the present disclosure relates to a computer program comprising a program code for performing a method according to the second and/or third and/or fourth aspect and/or any one of their implementation forms when executed on a computer. Thereby, the method can be performed in an automatic and repeatable manner.

The computer program may be performed by the above device.

More specifically, it should be noted that the above device may be implemented based on a discrete hardware circuitry with discrete hardware components, integrated chips or arrangements of chip modules, or based on a signal processing device or chip controlled by a software routine or program stored in a memory, written on a computer-readable medium or downloaded from a network such as the Internet.

These and other aspects of the present disclosure will be apparent and elucidated with reference to the exemplary embodiments described hereinafter.

BRIEF DESCRIPTION OF THE DRAWINGS

In the following, the present disclosure will be explained in more detail with reference to the exemplary embodiments shown in the drawings, in which:

FIG. 4 shows the different conversion steps (B1 → B2, B1 → B2 → B) illustrating how to obtain a z-row-orthogonal base matrix (B2, B) of size mb×nb starting from a base matrix (B1) of smaller size, according to an exemplary embodiment of the present disclosure.

Identical reference signs are used for identical or at least functionally equivalent features.

DETAILED DESCRIPTION

In the present disclosure, a z-row-orthogonal base matrix of size mb×nb may be defined as a base matrix composed of a set of submatrices, wherein all or all but one submatrices are of size z×nb with z>1 and at most one submatrix is of size z'×nb with z'<z. The terms z, z', mb and nb are positive natural numbers, while the terms mb and nb also denote a respective number of rows and columns.

A z-row-orthogonal base matrix may be used to describe or represent a LDPC code, and presents an advantage that, upon expansion of the z-row-orthogonal base matrix by a factor q, a higher row decoder parallelization, i.e., a row decoder parallelization of a factor q×z, can be obtained for the resulting LDPC code.

It shall be noted that the submatrices do not necessarily consist of subsequent rows, so that one submatrix may, for example, not contain the first and second rows of the associated z-row orthogonal base matrix but rather contain the first and third rows.

Figure 1:
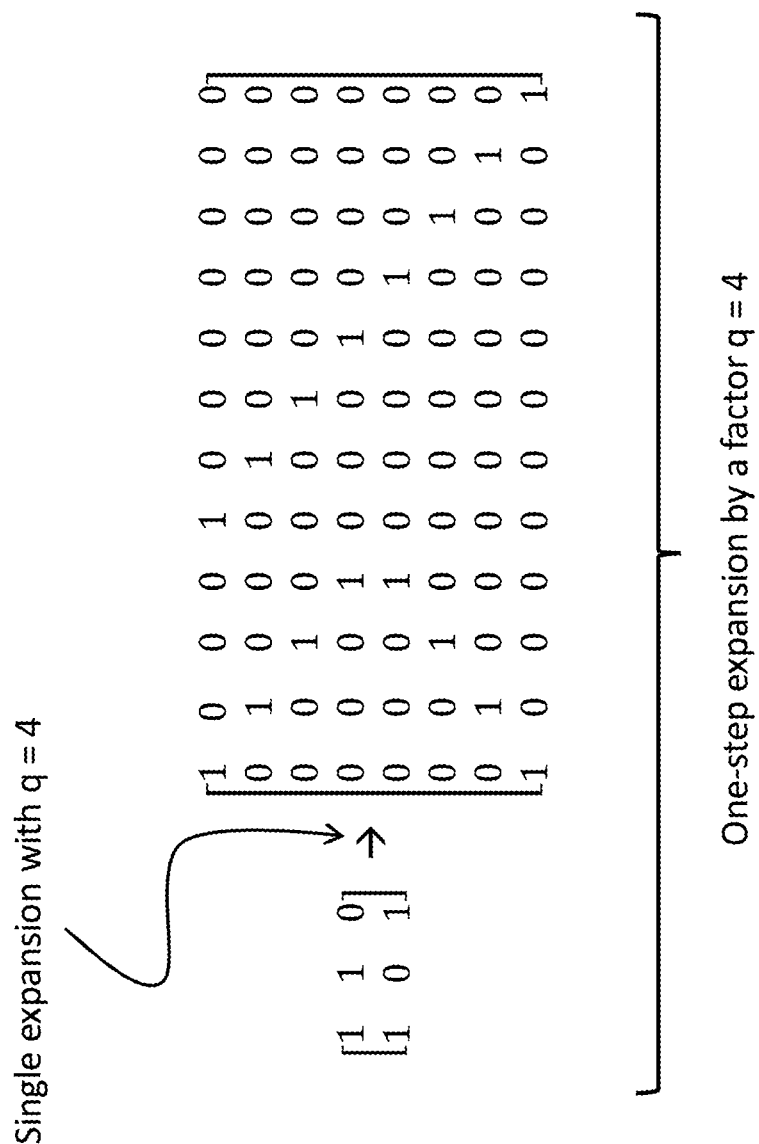
FIG. 1 shows an example of an expansion of a base matrix of size 2×3 carried out in one step with a single expansion factor q equal to 4.
Figure 2:
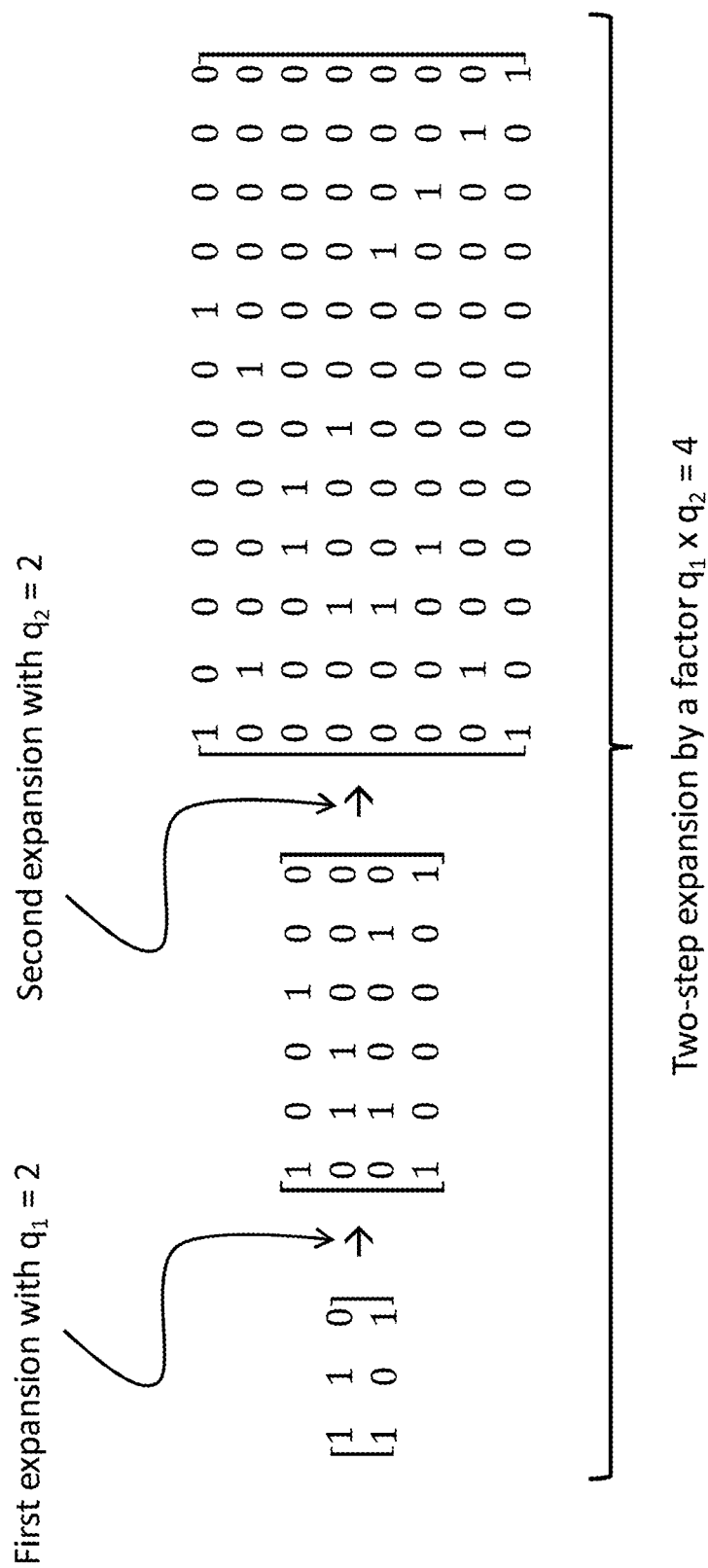
FIG. 2 shows an example of an expansion of a base matrix of size 2×3 carried out in two steps with a first expansion factor $q_1$ equal to 2 (first step) and a second expansion factor $q_2$ equal to 2 (second step)
Figure 3:
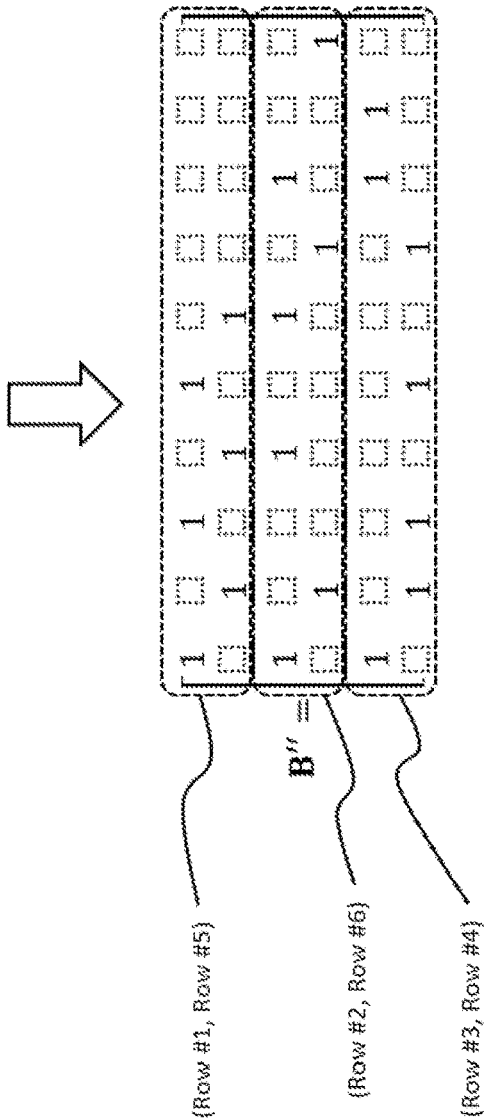
FIG. 3 shows the different conversion steps (B → B' → B") illustrating how to demonstrate the z-row-orthogonality of a base matrix (B) of size mb×nb, according to an exemplary embodiment of the present disclosure.

Referring to FIG. 3 illustrating how to demonstrate the z-row-orthogonality of a base matrix, consider the following exemplary base matrix B of size mb×nb with mb=6, nb=10 and z=2.

$$B = \begin{bmatrix} 1 & & 1 & & 1 & & & & & \\ 1 & & & 1 & & 1 & & 1 & & \\ & & 1 & & 1 & 1 & & & & \\ & 1 & 1 & & 1 & & 1 & & & \\ 1 & & & & & & & & 1 & 1 \\ & 1 & & & & & & 1 & & 1 \end{bmatrix} \quad (2)$$

A first step may consist in sorting each row of the exemplary base matrix B in a descending order of a respective row identifier in order to obtain a sorted matrix B' as follows:

$$B' = \begin{bmatrix} 1 & & 1 & & 1 & & & & & \\ 1 & & & 1 & & 1 & & 1 & & \\ 1 & & & & & & & & 1 & 1 \\ & 1 & 1 & & 1 & & 1 & & & \\ & & 1 & & 1 & 1 & & & & \\ & 1 & & & & & & 1 & & 1 \end{bmatrix} \quad (3)$$

To that extent, a row identifier may be defined as a decimal number derived from a binary number determined by all entries of the corresponding row. Thus, the rows of the sorted matrix B' correspond, in an ascending order, to the first, second, fifth, fourth, third, and sixth rows of the exemplary base matrix B. In the present example, the row identifier of the fifth row of the base matrix B has a value equal to $2^9+2^2+2^1=512+4+2=518$, while the row identifier of the third row of the base matrix B has a lower value equal to $2^8+2^6+2^5=256+64+32=352$. It results therefrom that, in the sorted matrix B', the third row of the base matrix B is ranked in a higher position (i.e., fifth position) than that (i.e., third position) of the fifth row of the base matrix B.

From the first two columns of the sorted matrix B', it can be seen that the base matrix B is not q-row-orthogonal with q>2. To see that the base matrix B is, in the present example, 2-row-orthogonal, a grouping step consisting in forming a set of submatrices may then be needed. To generalize, the number of submatrices may not be a multiple of z and the submatrices may not be of an identical size. In the present exemplary case, merely for the sake of simplicity, the number of submatrices will be chosen to be a multiple of z and each submatrix will have the same size.

Thus, starting from the proposed simplification, a second step may consist in grouping each row of the sorted matrix B' together with z−1 other rows of the sorted matrix B' in order to form a set of mb/z submatrices of size z×nb, each submatrix having a maximum column weight of one. In the present exemplary case (i.e., z=2, mb=6, nb=10), the second step consists in grouping each row of the sorted matrix B' amongst the six (6) rows together with one (1) row of the sorted matrix B' in order to form the set of three (3) submatrices of size 2×10, each submatrix having a column weight of at most one. To do so, the possible combinations between each row of the sorted matrix B' and the other rows of the sorted matrix B' may be gathered in a table exhibiting the row number in a first column and the list of the candidate rows in a second column. In the present exemplary case (i.e., z=2, mb=6, nb=10), the table may correspond to the following Table I:

TABLE I

Possible grouping of rows for the sorted matrix B'

| Row number (Row #) | Candidate rows |
|---|---|
| 1 | 5, 6 |
| 2 | 4, 6 |
| 3 | 4, 5, 6 |
| 4 | 2, 3 |
| 5 | 1, 3 |
| 6 | 1, 2, 3 |

It can be observed from Table I that, for example, the first (1) row of the sorted matrix B' can pair with two candidate rows (i.e., the fifth (5) or sixth (6) row) of the sorted matrix B', because the submatrix formed by the pair (1, 5) or by the pair (1, 6) has a maximum column weight of one.

A third step to demonstrate the z-row-orthogonality of the base matrix B of size 6×10 may consist in grouping the set of three (3) submatrices of size 2×10 in order to obtain a grouped matrix B" of size 6×10 as follows:

$$B'' = \begin{bmatrix} 1 & & 1 & & & 1 & & & & \\ & 1 & & & 1 & 1 & & & & \\ 1 & - & - & 1 & & 1 & - & 1 & - & - \\ & 1 & & & & & & 1 & & 1 \\ 1 & - & - & - & - & - & - & 1 & 1 & - \\ & 1 & 1 & & 1 & & 1 & & & \end{bmatrix} \quad (4)$$

wherein each row of the grouped matrix B" corresponds to a respective row of the sorted matrix B' and each submatrix has a column weight of at most one.

It shall be noted that the submatrices may be grouped in any order because each submatrix has a maximum column weight of one. In the present exemplary case (i.e., z=2, mb=6, nb=10), the three (3) submatrices of size 2×10 are grouped together in such a manner that the first, second and third submatrices, which are respectively composed of the pair of rows (1, 5), (2, 6) and (3, 4) of the sorted matrix B', correspond to the respective pair of rows (1, 2), (3, 4) and (5, 6) of the grouped matrix B".

To obtain a z-row-orthogonal base matrix of size mb×nb, a first method and a second method derived from the first one may, in a non-limitative manner, be proposed.

In the first method, a first step consists in constructing a small base matrix, e.g., a base matrix B1 of size mb/z×nb/z, wherein each entry of the base matrix B1 is equal to zero or one.

A second step of the first method consists in expanding the base matrix B1 by a factor equal to z in such a manner as to obtain an expanded base matrix B2 of size mb×nb that is z-row-orthogonal. The z-row-orthogonal expanded base matrix B2 may then be used as such to describe or represent a LDPC code.

Once the first method has been achieved, the second method may be triggered when the code designer decides to redesign the LDPC code by modifying (e.g., improving or altering) the properties of the expanded base matrix B2 while preserving the z-row-orthogonality.

In a first exemplary embodiment of the second method, modifying the expanded base matrix B2 into a modified base matrix B may consist in adding into the expanded base matrix B2 or removing from the expanded base matrix B2 at least one entry equal to one at a respective location of the expanded base matrix B2 that is chosen so as to allow the modified base matrix B to exhibit a z-row orthogonality.

In a second exemplary embodiment of the second method, modifying the expanded base matrix B2 into a modified base matrix B may consist in permuting at least one column and/or at least one row of the expanded base matrix B2 in such a manner that the modified base matrix B can exhibit a z-row orthogonality.

In a third exemplary embodiment of the second method, modifying the expanded base matrix B2 into a modified base matrix B may consist in adding into the expanded base matrix B2 or removing from the expanded base matrix B2 at least one row in such a manner that the modified base matrix B can exhibit a z-row orthogonality.

In a fourth exemplary embodiment of the second method, modifying the expanded base matrix B2 into a modified base matrix B may consist in a combination of the first, second and third embodiments.

FIG. 4 illustrates the conversion steps to obtain a z-row-orthogonal base matrix with z=2. Starting from a construction of an exemplary base matrix B1 of size 3×5, the base matrix B1 is then expanded by a factor of z=2 as to obtain an expanded base matrix B2 of size 6×10 exhibiting a 2-row-orthogonality. As depicted, the expanded base matrix B2 is formed of three submatrices (i.e., submatrix 1, submatrix 2, submatrix 3), each having a respective column weight of at most one. The code designer may decide to use the code as represented by the expanded base matrix B2 or to modify this code into a new code represented by a modified base matrix B with the aim, for example, of improving the distance properties. Referring, for example, to the aforementioned first embodiment of the second method, the modification may thus consist in adding a one-entry (depicted in brackets) into the expanded base matrix B2 at such a location that the modified base matrix B exhibits a 2-row-orthogonality. It results therefrom that the submatrix 1 is modified into a submatrix 1', so that the modified base matrix B is formed of three submatrices, namely submatrix 1', submatrix 2 and submatrix 3, each having a respective column weight of at most one. As above-mentioned, the modified base matrix B is also row-orthogonal similarly to the expanded base matrix B2, but unlike it, the modified base matrix B cannot be obtained from the base matrix B1 directly, but only indirectly via the expanded base matrix B2.

In the case where specific structures (e.g., a diagonal structure and/or a double-diagonal structure) are required for the base matrix B of the first method, the second step (i.e., the expansion step) of the first method needs to be modified. A common constraint may be to impose, for example, a double-diagonal structure to the rightmost columns of the base matrix B. In this case, the permutations of the edges among the protograph copies are not arbitrary anymore, but need to obey certain rules. Typically, they are chosen to be identity matrices.

Consider the construction of a structured base matrix (or structured protograph) from a base matrix in such a manner that the structured base matrix is z-row-orthogonal and also formed of some parts having a specific structure (e.g., WiMAX, IRA, etc.). Such a z-row-orthogonal base matrix with additional constraints in terms of specific structure presents the advantage to allow a high parallelization that is a multiple of z, while having an efficient encoding or decoding.

The structured base matrix may, for example, have a WiMAX-like structure, which requires that the base matrix comprises a specific square submatrix A (e.g., a submatrix of size a×a, where a is a positive natural number) as defined hereafter:

$$A = \begin{bmatrix} 1 & 1 & & & & \\ \ldots & 1 & 1 & & & \\ 1 & & 1 & 1 & & \\ \ldots & & & & 1 & 1 \\ 1 & & & & & 1 \end{bmatrix} \quad (5)$$

As can be seen, the submatrix A in the exemplary case of a WiMAX-like structure is structured in such a manner as to have one degree-3 column and degree-2 columns for the remaining columns. In particular, the first column contains three one-entries with a respective one-entry in the first row, the last row and an arbitrary row between the first row and the last row, while the subsequent columns contain two one-entries and are arranged in a double-diagonal structure.

In another exemplary case, the structured base matrix may have an IRA-like structure, which requires that the base matrix comprises a specific square submatrix A' (e.g., a submatrix of size a×a, where a is a positive natural number) as defined hereafter:

$$A' = \begin{bmatrix} 1 & 1 & & & & \\ \ldots & 1 & 1 & & & \\ & & 1 & 1 & & \\ \ldots & & & & 1 & 1 \\ & & & & & 1 \end{bmatrix} \quad (6)$$

As can be seen, the submatrix A' is structured in such a manner as to have one degree-1 column and degree-2 columns arranged in a double-diagonal structure for the remaining columns.

To construct a z-row-orthogonal base matrix of size mb×nb having, for example, a WiMAX-like structure, a first method and a second method may, in a non-limitative manner, be proposed.

The first method may start from a matrix of size mb×nb whose entries are all equal to zero and consist, in a first step, in inserting the structured submatrix A into the matrix, in such a manner as to obtain the following base matrix B:

$$B = \begin{bmatrix} \ldots & \ldots & \ldots & \ldots & \ldots & \ldots & \ldots \\ & 1 & 1 & & & & \\ & \ldots & 1 & 1 & & & \\ & 1 & & 1 & 1 & & \\ & \ldots & & & & 1 & 1 \\ & 1 & & & & & 1 \\ \ldots & \ldots & \ldots & \ldots & \ldots & \ldots & \ldots \end{bmatrix} \quad (7)$$

In a second step of the first method, the base matrix B may be arranged into a z-row-orthogonal matrix of size mb×nb, namely arranged in such a manner as to obtain a set of at least mb/z submatrices having each a maximum column weight of one.

In an optional third step of the first method, further one-entries may be successively placed in the arranged base matrix based on code design constraints and at such a location that the z-row-orthogonality is preserved.

As regards the second method, a first step may consist in constructing a smaller matrix $\ddot{B}$, e.g., a base matrix of size mb/z×nb/z, whose entries are either zero or one and which fulfills the code design criteria. Those criteria may comprise the number of rows and columns whose ratio determines the code rate, and also comprise the number of ones per row and column (i.e., the check and variable node degrees). The base matrix $\ddot{B}$ is constructed in such a manner as to have its rightmost (i.e., upper) part, denoted by $\ddot{A}$, which is arranged in a double-diagonal shape with tail-biting one (shown in brackets) and forms a square matrix, for example, of size a/z×a/z, where a is a positive natural number, as defined hereafter:

$$\ddot{A} = \begin{bmatrix} 1 & & & [1] \\ 1 & 1 & & \\ & 1 & \ldots & \\ & & & 1 \end{bmatrix} \quad (8)$$

In a second step of the second method, the base matrix $\ddot{B}$ may be expanded by a factor equal to z in order to obtain a matrix B' of size mb×nb in such a manner that the matrix B' is z-row-orthogonal. The expansion of the base matrix $\ddot{B}$ as to obtain the z-row-orthogonal base matrix B' may comprise applying a cyclic shift of one or more z×z identity matrices to the base matrix $\ddot{B}$ amputated of the rightmost part $\ddot{A}$, wherein the cyclic shifts are freely chosen, and applying, to the rightmost part $\ddot{A}$ amputated of the tail-biting one, a cyclic shift of one or more z×z identity matrices by z−1 to the right.

In a third step of the second method, a base matrix B" of size mb×nb may be obtained by adding a single one-entry into the base matrix B' at such a location of the base matrix B' that the base matrix B" is z-row-orthogonal. The single one-entry may be added at an intersection of the last column (i.e., the nbth column, where nb is a column index) of the base matrix B' and a predetermined row (e.g., a rth row, where r is a row index) of the base matrix B'. To preserve the z-row-orthogonality, the base matrix B" shall contain no additional row entries in the rows of index: 2, . . . , q, and in the rows of index: mb−q+1, . . . , mb−1. Thus, the row index r shall be chosen from the set {1, . . . , mb} \ {{1, . . . , q}, {mb−q+1, . . . , mb}}.

In a fourth step of the second method, at least one column and/or at least one row of the base matrix B" may be permuted in order to obtain a base matrix B'" arranged in a diagonal shape with tail-biting one.

In a fifth step of the second method, the rightmost part of the base matrix B'" is denoted A'" and may form a square submatrix of size a×a. A column-wise cyclic shift of this rightmost part A'" by one to the right may be performed in order to obtain the square submatrix A of size a×a as defined by the relationship (5). The submatrix A'" may then be replaced with the submatrix A in the base matrix B'" in order to obtain the z-row-orthogonal WiMAX-like base matrix B.

The second method may be illustrated starting from the following base matrix $\ddot{B}$ of size 3×4:

$$\ddot{B} = \begin{bmatrix} 1 & 1 & & 1 \\ 1 & 1 & 1 & \\ 1 & & 1 & 1 \end{bmatrix} \quad (9)$$

In conjunction with the above-mentioned first step, the base matrix $\ddot{B}$ has its rightmost part corresponding to a square matrix $\ddot{A}$ of size 3×3 which is arranged in a double-diagonal structure with tail-biting one.

After applying the structured expansion of the second step, the following 2-row-orthogonal base matrix B' can be obtained:

$$B' = \begin{bmatrix} 1 & 1 & & & & 1 \\ & 1 & 1 & & 1 & \\ 1 & 1 & 1 & & & \\ & 1 & 1 & 1 & & \\ 1 & & & 1 & 1 & \\ & 1 & & & 1 & 1 \end{bmatrix} \quad (10)$$

By applying the one-entry addition of the third step, two options are possible to add a one-entry into the base matrix B' while preserving the 2-row-orthogonality. After selecting one option, the following base matrix B" can then be obtained:

$$B'' = \begin{bmatrix} 1 & 1 & & & & 1 \\ & 1 & 1 & & 1 & \\ 1 & 1 & 1 & & & [1] \\ & 1 & 1 & 1 & & \\ 1 & & & 1 & 1 & \\ & 1 & & & 1 & 1 \end{bmatrix} \quad (11)$$

where the added one-entry is shown in brackets.

After applying the permutation of the fourth step, the following base matrix B''' can be obtained:

$$B''' = \begin{bmatrix} 1 & 1 & & & & 1 \\ 1 & 1 & 1 & & & [1] \\ 1 & & 1 & 1 & & \\ & 1 & & 1 & 1 & \\ & & 1 & & 1 & 1 \\ & & & 1 & & 1 & 1 \end{bmatrix} \quad (12)$$

After applying the shift and replacement of the fifth step, the following 2-row-orthogonal WiMAX-like base matrix B, which contains the structured submatrix A of size a×a, can be obtained:

$$B = \begin{bmatrix} 1 & & 1 & 1 & & \\ 1 & [1] & 1 & 1 & & \\ 1 & & & 1 & 1 & \\ & 1 & & & 1 & 1 \\ & & 1 & & & 1 & 1 \\ & 1 & 1 & & & & 1 \end{bmatrix} \quad (13)$$

Indeed, the base matrix B is 2-row orthogonal since it was obtained from a 2-row-orthogonal matrix B' through successive steps of one-entry addition (third step) and row/column permutation (fourth step), which does not destroy the row orthogonality.

The present disclosure, as explained above, relates to a type of protograph-based LDPC codes, which are obtained from z-row-orthogonal base matrices with some additional structure constraints, such as a diagonal and/or double-diagonal structure, in order to allow a high parallelization that is a multiple of z, while having an efficient encoding or decoding. In particular, in an exemplary embodiment, a "big" base matrix is constructed from a structured square submatrix in order to have a WiMAX-like structure and a z-row-orthogonality. In another exemplary embodiment starting from a "smaller" base matrix having a part arranged in a double-diagonal shape with tail-biting one, an expansion by a factor equal to z is performed, followed by an addition of a single one-entry into the last column at a specific location, thereby obtaining a three-degree column, and followed by a row and/or column permutation in order to obtain a base matrix in a WiMAX-like structure.

While the present disclosure has been illustrated and described in detail respectively in the drawings and the foregoing description, such illustration and description are to be considered illustrative or exemplary and not restrictive. The present disclosure is not limited to the disclosed embodiments. From reading the present disclosure, other modifications will be apparent to a person skilled in the art. Such modifications may involve other features, which are already known in the art and may be used instead of or in addition to features already described herein.

The present disclosure has been described in conjunction with various embodiments herein. However, other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems.

Although the present disclosure has been described with reference to specific features and exemplary embodiments thereof, it is evident that various modifications and combinations can be made thereto without departing from the spirit and scope of the disclosure. The specification and drawings are, accordingly, to be regarded simply as an illustration of the invention as defined by the appended claims, and are contemplated to cover any and all modifications, variations, combinations or equivalents that fall within the scope of the present invention.

What is claimed is:

1. A device for providing a matrix for data processing within a communication system the device comprising a processor, and a memory storing program instructions for execution by the processor, wherein when the program instructions are executed by the processor, the processor is configured to:

construct a first matrix, wherein all entries of the first matrix are either zero or one, wherein the first matrix is composed of a set of submatrices and each submatrix has a maximum column weight of one, and wherein each submatrix is obtained through grouping each row of the first matrix with one or more rest row of the first matrix;

expand the first matrix by a factor equal to z into an expanded matrix of size mb×nb in such a manner that the expanded matrix is z-row-orthogonal;

modify the expanded matrix into a second matrix of size mb×nb in such a manner that the second matrix is z-row-orthogonal; and encode or decode data within the communication system based on the first matrix for a high parallelization of row decoding operations.

2. The device of claim 1, wherein the processor is configured, according to the program instructions, to modify the expanded matrix by performing an operation comprising:

adding into the expanded matrix or removing from the expanded matrix at least one entry equal to one at a respective location of the expanded matrix that is chosen in such a manner that the second matrix is z-row-orthogonal.

3. The device of claim 1, wherein the processor is configured, according to the program instructions, to modify the expanded matrix by performing an operation comprising:

adding into the expanded matrix or removing from the expanded matrix at least one row in such a manner that the second matrix is z-row-orthogonal.

4. The device of claim 1, wherein the degree-2 columns of the submatrix are arranged in a double-diagonal structure.

5. The device of claim 1, wherein the processor is configured, according to the program instructions, to modify the expanded matrix by performing an operation comprising:

adding, at a respective location of the matrix, at least one entry equal to one into the matrix, wherein the respective location is chosen to preserve a z-row orthogonality of the matrix.

6. The device of claim 1, wherein:

a single entry equal to one is added at an intersection of the last column of the second matrix and a predetermined row of the second matrix.

7. The device of claim 1, wherein the matrix comprises a square submatrix A, the square submatrix A being $$A = \begin{bmatrix} 1 & 1 & & & \\ \ldots & 1 & 1 & & \\ 1 & & 1 & 1 & \\ \ldots & & & 1 & 1 \\ 1 & & & & 1 \end{bmatrix}.$$

8. The device of claim 1, wherein the matrix represents a low-density parity-check (LDPC) code.

9. The device of claim 1, wherein when the program instructions are executed by the processor, the processor is further configured to: encode or decode data using the second matrix.

10. A method for providing a matrix for data processing within a communication system, comprising:

constructing, by one or more processors, a first matrix, wherein all entries of the first matrix are either zero or one, wherein the first matrix is composed of a set of submatrices and each submatrix has a maximum column weight of one, and wherein each submatrix is obtained through grouping each row of the first matrix with one or more rest row of the first matrix;

expanding, by the one or more processors, the first matrix by a factor equal to z into an expanded matrix of size mb×nb in such a manner that the expanded matrix is z-row-orthogonal;

modifying, by the one or more processors, the expanded matrix into a second matrix of size mb×nb in such a manner that the second matrix is z-row-orthogonal; and encoding or decoding, by the one or more processors, data within the communication system based on the first matrix for a high parallelization of row decoding operations.

11. The method according to claim 10, wherein the expanded matrix is modified by performing an operation comprising:

adding into the expanded matrix or removing from the expanded matrix, by the one or more processors, at least one entry equal to one at a respective location of the expanded matrix that is chosen in such a manner that the second matrix is z-row-orthogonal.

12. The method according to claim 10, wherein the expanded matrix is modified by performing an operation comprising:

adding into the expanded matrix or removing from the expanded matrix, by the one or more processors, at least one row in such a manner that the second matrix is z-row-orthogonal.

13. The method according to claim 10, wherein the matrix represents a low-density parity-check (LDPC) code.

14. The method according to claim 10, further comprising:

encoding or decoding, by the one or more processors, data using the second matrix.

15. A non-transitory computer-readable medium for providing a matrix for data processing within a communication system storing program instructions that when executed by a processor cause the processor to:

construct a first matrix, wherein all entries of the first matrix are either zero or one, wherein the first matrix is composed of a set of submatrices and each submatrix has a maximum column weight of one, and wherein each submatrix is obtained through grouping each row of the first matrix with one or more rest row of the first matrix;

expand the first matrix by a factor equal to z into an expanded matrix of size mb×nb in such a manner that the expanded matrix is z-row-orthogonal;

modify the expanded matrix into a second matrix of size mb×nb in such a manner that the second matrix is z-row-orthogonal; and encode or decode data within the communication system based on the first matrix for a high parallelization of row decoding operations.

16. The non-transitory computer-readable medium of claim 15, wherein program instructions that when executed by the processor further cause the processor to modify the expanded matrix by performing an operation comprising:

adding into the expanded matrix or removing from the expanded matrix at least one entry equal to one at a respective location of the expanded matrix that is chosen in such a manner that the second matrix is z-row-orthogonal.

17. The non-transitory computer-readable medium of claim 15, wherein program instructions that when executed by the processor further cause the processor to modify the expanded matrix by performing an operation comprising:

adding into the expanded matrix or removing from the expanded matrix at least one row in such a manner that the second matrix is z-row-orthogonal.

18. The non-transitory computer-readable medium of claim 15, wherein the matrix represents a low-density parity-check (LDPC) code.

19. The non-transitory computer-readable medium of claim 15, wherein the program instructions that when executed by the processor further cause the processor to:

encode or decode data using the second matrix.

* * * * *

UNITED STATES PATENT AND TRADEMARK OFFICE
CERTIFICATE OF CORRECTION

PATENT NO. : 11,309,917 B2
APPLICATION NO. : 16/901934
DATED : April 19, 2022
INVENTOR(S) : Matuz et al.

It is certified that error appears in the above-identified patent and that said Letters Patent is hereby corrected as shown below:

In the Claims

Claim 1: Column 13, Line 7: "expanded matrix of size mb×nb in such a manner that" should read -- expanded matrix of size mb × nb in such a manner that --.

Claim 1: Column 13, Line 10: "mb×nb in such a manner that the second matrix is" should read -- mb × nb in such a manner that the second matrix is --.

Claim 10: Column 14, Line 6: "mb×nb in such a manner that the expanded matrix is" should read -- mb × nb in such a manner that the expanded matrix is --.

Claim 10: Column 14, Line 9: "matrix into a second matrix of size mb×nb in such a" should read -- matrix into a second matrix of size mb × nb in such a --.

Claim 15: Column 14, Line 49: "expanded matrix of size mb×nb in such a manner that" should read -- expanded matrix of size mb × nb in such a manner that --.

Claim 15: Column 14, Line 52: "mb×nb in such a manner that the second matrix is" should read -- mb × nb in such a manner that the second matrix is --.

Signed and Sealed this
Twenty-third Day of August, 2022

*Katherine Kelly Vidal*
Katherine Kelly Vidal
*Director of the United States Patent and Trademark Office*